United States Patent
Ishibashi

(10) Patent No.: US 9,677,811 B2
(45) Date of Patent: Jun. 13, 2017

(54) SUBSTRATE CLEANING AND DRYING APPARATUS

(71) Applicant: Ebara Corporation, Tokyo (JP)

(72) Inventor: Tomoatsu Ishibashi, Tokyo (JP)

(73) Assignee: Ebara Corporation, Tokyo (JP)

( * ) Notice: Subject to any disclaimer, the term of this patent is extended or adjusted under 35 U.S.C. 154(b) by 377 days.

(21) Appl. No.: 14/448,574

(22) Filed: Jul. 31, 2014

(65) Prior Publication Data

US 2015/0040419 A1 Feb. 12, 2015

(30) Foreign Application Priority Data

Aug. 7, 2013 (JP) ................................. 2013-164217

(51) Int. Cl.
  *F26B 21/00* (2006.01)
  *H01L 21/67* (2006.01)
  *F26B 5/08* (2006.01)

(52) U.S. Cl.
  CPC .............. *F26B 21/004* (2013.01); *F26B 5/08* (2013.01); *H01L 21/67028* (2013.01); *H01L 21/67051* (2013.01); *H01L 21/67173* (2013.01)

(58) Field of Classification Search
  CPC .... F26B 21/004; F26B 5/08; H01L 21/67051; H01L 21/67173; H01L 21/67028
  See application file for complete search history.

(56) References Cited

U.S. PATENT DOCUMENTS

| | | | |
|---|---|---|---|
| 2011/0180213 A1* | 7/2011 | Hirayama | H01J 37/32192 156/345.33 |
| 2013/0171831 A1* | 7/2013 | Namba | H01L 21/32134 438/748 |

FOREIGN PATENT DOCUMENTS

| JP | 3556043 | 5/2004 |
|---|---|---|
| JP | 2009-117794 | 5/2009 |

* cited by examiner

*Primary Examiner* — Jiping Lu

(74) *Attorney, Agent, or Firm* — Leydig, Voit & Mayer, Ltd.

(57) ABSTRACT

An apparatus for cleaning and drying a substrate is disclosed. The apparatus includes a substrate holder configured to hold a substrate, a rotating device configured to rotate the substrate holder, a cylindrical cup surrounding a peripheral portion of the substrate, and a gas ejector disposed below the substrate. The gas ejector has at least one gas discharge opening arranged along an entire circumference of the substrate. The gas ejector is configured to discharge a gas downwardly from the gas discharge opening to induce downward flow of air in a gap between a peripheral portion of the substrate and the cylindrical cup.

5 Claims, 18 Drawing Sheets

ROTATIONAL DIRECTION →

SUBSTRATE CLEANING AND DRYING APPARATUS

CROSS REFERENCE TO RELATED APPLICATION

This application claims priority to Japanese Patent Application No. 2013-164217 filed Aug. 7, 2013, the entire contents of which are hereby incorporated by reference.

BACKGROUND

As semiconductor devices have been becoming finer in recent years, various material films having different properties are formed on a substrate, which is processed to provide the semiconductor devices. In particular, in a damascene interconnect forming process for forming interconnects by filling a metal into interconnect trenches formed in the substrate, an excessive metal is polished away by a substrate polishing apparatus after the damascene interconnect forming process is performed. Various films, such as a metal film, a barrier film, and a dielectric film, having different wettabilities with respect to water, are exposed on the substrate surface that has been polished. Residues, such as slurry used in polishing and polishing debris, remain on these films that are exposed on the substrate surface. In order to remove these residues, the polished substrate is transported to a substrate cleaning and drying apparatus, where the substrate surface is cleaned and dried (See Japanese laid-open patent publication No. 2009-117794 and Japanese patent publication No. 3556043).

However, if the cleaning of the substrate surface is insufficient, reliability problems, such as poor adhesion and a current leak at a portion to which the residues are attached, may occur. Therefore, in manufacturing of the semiconductor device, the cleaning and drying of the substrate have been becoming an important process for improving a product yield.

FIG. 16 shows a schematic cross-sectional view of an example of a substrate cleaning and drying apparatus. This substrate cleaning and drying apparatus includes a substrate holder 301 for holding a substrate W, a motor 302 for rotating the substrate holder 301, a cylindrical cup 303 disposed around the substrate W, and a cleaning liquid supply nozzle 304 for supplying a cleaning liquid, such as pure water or a chemical liquid, onto the surface of the substrate W. The substrate holder 301 includes a substrate stage 311 coupled to the motor 302 through a support shaft 312. A plurality of chucks 310 for gripping a peripheral portion of the substrate W are provided on the substrate stage 311.

When the substrate W is cleaned, the cleaning liquid is supplied onto the surface of the substrate W while the substrate W is rotated by the motor 302 at a relatively low speed (for example, about 300 to 600 $\text{min}^{-1}$). When the substrate W is dried, the substrate W is rotated at a relatively high speed (for example, about 1000 to 2000 $\text{min}^{-1}$) so as to spin off the cleaning liquid from the surface of the substrate W. The cleaning liquid, spun off from the substrate W, is caught by the cylindrical cup 303 and is then recovered or discarded.

As shown in FIG. 16, the cylindrical cup 303 is typically disposed around the substrate W that is rotated by the motor 302. The cylindrical cup 303 has an inner circumferential surface that receives the liquid scattered around by the rotation of the substrate W. The cylindrical cup 303 can thus prevent the liquid from being scattered, and can downsize the apparatus in its entirety. A liquid pan 363 is provided at the bottom of the cylindrical cup 303, and exhaust ports 315 are formed in this liquid pan 363. The exhaust ports 315 are coupled to a suction device (not shown), such as a vacuum pump, so that air in the cylindrical cup 303 is exhausted together with the cleaning liquid through the exhaust ports 315.

However, it is difficult to make a uniform exhaust environment around the rotating substrate W in the substrate cleaning and drying apparatus having the above-described constitution. More specifically, a velocity of an exhaust flow is high in a region close to the exhaust port 315, while a velocity of an exhaust flow is low in a region distant from the exhaust port 315. A schematic view of such exhaust flow is shown in FIG. 17. FIG. 17 is a schematic view illustrating the velocity of the exhaust flow in the case where the inside of the cylindrical cup 303 is exhausted through one exhaust port 315 provided in the bottom of the liquid pan 363. In FIG. 17, the flow velocity is indicated by size of arrow. When only one exhaust port 315 is provided as shown in FIG. 17, uniform exhaust flow having an equal velocity cannot be formed around the substrate W. Furthermore, since the substrate W is rotated together with the substrate stage 311, the air flow in the cylindrical cup 303 is stirred, and as a result an upward flow may be generated between the substrate W and the cylindrical cup 303.

When the substrate W is rotated, if the velocity of the exhaust flow around the substrate is not uniform, or in particular if the upward flow is generated on the peripheral portion of the substrate W, mist and droplets of the cleaning liquid (e.g., pure water) that has been once removed from the substrate W may be carried onto the substrate W. The mist and the droplets of the cleaning liquid, attached again to the substrate W, may produce water-marks on the surface of the substrate W. The water-marks adversely affect devices formed on the substrate W, thus reducing a product yield. Moreover, the cleaning liquid that has been attached again may cause a back contamination of the substrate W. Furthermore, when the substrate W is dried by the rotation of the substrate, if the velocity of the exhaust flow around the substrate is not uniform, the peripheral portion of the substrate W is not dried uniformly. Therefore, it is an important issue for the substrate cleaning and drying apparatus to make the exhaust environment uniform around the substrate.

In order to solve the above-described issue, the following construction is proposed. Plural exhaust holes 315a whose diameters become gradually larger in accordance with a distance from the exhaust port 315 are provided around the peripheral portion of the substrate so that air that has passed through these exhaust holes 315a is exhausted through the exhaust port 315. FIG. 18 shows a schematic view showing the exhaust flow according to this structure. In FIG. 18, the flow velocity is indicated by size of arrow. The construction shown in FIG. 18 can improve the uniformity of the exhaust environment to some extent, compared with the construction shown in FIG. 17. However, it is difficult to make the velocity of the exhaust flow completely uniform around the substrate W.

SUMMARY OF THE INVENTION

It is therefore an object to provide a substrate cleaning and drying apparatus which can make the exhaust environment uniform around the substrate.

Embodiments, which will be described below, relate to a substrate cleaning and drying apparatus for cleaning a substrate by supplying a cleaning liquid (e.g., pure water or chemical liquid) onto the substrate and then drying the cleaned substrate. The substrate cleaning and drying apparatus according to the embodiments can be applied to cleaning of a wafer having a diameter of 300 mm, as well as cleaning of a wafer having a diameter of 450 mm. Furthermore, the substrate cleaning and drying apparatus according to the embodiments can be applied to a fabrication process of a flat-panel, a fabrication process of an image sensor, such as CMOS (Complementary Metal-Oxide Semiconductor) and CCD (Charge Coupled Device), and a fabrication process of a magnetic film of MRAM (Magnetoresistive Random Access Memory).

In an embodiment, there is provided a substrate cleaning and drying apparatus, comprising: a substrate holder configured to hold a substrate; a rotating device configured to rotate the substrate holder; a cylindrical cup surrounding a peripheral portion of the substrate; and a gas ejector disposed below the substrate, the gas ejector having at least one gas discharge opening arranged along an entire circumference of the substrate and being configured to discharge a gas downwardly from the gas discharge opening to induce downward flow of air in a gap between a peripheral portion of the substrate and the cylindrical cup.

In an embodiment, the substrate cleaning and drying apparatus further comprises: a cylindrical skirt disposed below the substrate and configured to rotate together with the substrate holder, wherein the gas ejector includes gas intake elements secured to an inner circumferential surface of the cylindrical skirt, wherein the gas intake elements have gas intake openings that are open toward a rotational direction of the substrate holder, and wherein the gas intake openings communicate with the gas discharge opening located outside the cylindrical skirt.

In an embodiment, the gas intake openings are staggered with respect to a vertical direction such that adjacent gas intake openings are located at different heights.

In an embodiment, the at least one gas discharge opening comprises gas discharge openings arranged at equal intervals along the entire circumference of the substrate.

In an embodiment, the at least one gas discharge opening comprises an annular gas discharge opening disposed along the entire circumference of the substrate.

In an embodiment, the gas ejector includes a gas delivery conduit that delivers the gas, supplied from a gas supply source, to the gas discharge opening.

In an embodiment, the gas delivery conduit includes a gas supply pipe coupled to the gas supply source, a vertical pipe coupled to the gas supply pipe, a guide pipe coupled to the vertical pipe and configured to rotate together with the substrate holder, and a gas discharge element coupled to the guide pipe and having the gas discharge opening.

In an embodiment, the cylindrical cup is coupled to the substrate holder to be able to rotate in synchronization with the substrate holder, the gas ejector has gas intake elements secured to an outer circumferential surface of the cylindrical cup, the gas intake elements have gas intake openings that are open toward a rotational direction of the substrate holder, and the gas intake openings communicate with the gas discharge opening located inside the cylindrical cup.

According to the above-described embodiments, uniform downward flow is induced around the entire circumference of the substrate by the gas ejector. As a result, the exhaust environment around the substrate can be uniform, and water-marks on the surface of the substrate and a back contamination of the substrate can be prevented. Furthermore, the peripheral portion of the substrate can be uniformly dried.

DETAILED DESCRIPTION OF EMBODIMENTS

A substrate cleaning and drying apparatus according to embodiments will be explained with reference to the drawings.

Figure 1:
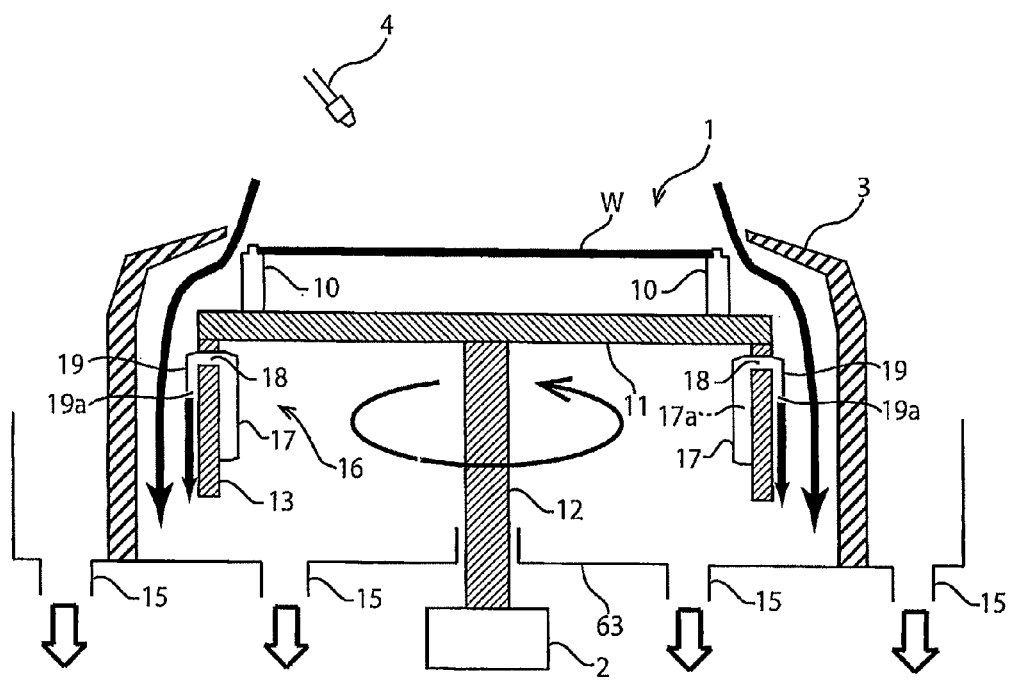
FIG. 1 is a schematic cross-sectional view showing a substrate cleaning and drying apparatus according to a first embodiment.

FIG. 1 is a schematic cross-sectional view showing a substrate cleaning and drying apparatus according to a first embodiment. As shown in FIG. 1, the substrate cleaning and drying apparatus includes a substrate holder 1 configured to hold a substrate W horizontally, a support shaft 12 secured to the substrate holder 1, a motor (i.e., a rotating device) 2 configured to rotate the substrate W about a central axis thereof through the substrate holder 1 and the support shaft 12, a cleaning liquid supply nozzle 4 configured to supply pure water as cleaning liquid onto a surface of the substrate W, and a cylindrical cup 3 disposed so as to surround a peripheral potion of the substrate W and configured to receive the pure water spun off from the rotating substrate W.

The cleaning liquid supply nozzle 4 is oriented toward a center of the substrate W. This cleaning liquid supply nozzle 4 is coupled to a pure water supply source (i.e., a cleaning liquid supply source), which is not illustrated, so that the pure water is supplied onto the center of the surface of the substrate W through the cleaning liquid supply nozzle 4. As the cleaning liquid, chemical liquid may be used instead of the pure water.

The substrate holder 1 has a plurality of chucks 10 for gripping the peripheral portion of the substrate W, and a circular substrate stage 11 to which these chucks 10 are secured. A cylindrical skirt 13 extends downwardly from a peripheral edge of the circular substrate stage 11 and is mounted to the peripheral edge of the circular substrate stage 11. A gas ejector 16 is provided on this cylindrical skirt 13. The gas ejector 16 is a device that forms jet flow of a working gas to produce a negative pressure at an upstream side of the jet flow to thereby deliver a target gas together with the jet flow of the working gas.

The cylindrical skirt 13 is secured to the substrate stage 11 and is rotated together with the substrate stage 11 and the substrate W. The substrate W held by the chucks 10, the cylindrical cup 3, and the cylindrical skirt 13 are coaxially arranged. A liquid pan 63 is provided on a lower portion of the cylindrical cup 3. A plurality of exhaust ports 15 are provided in a bottom of the liquid pan 63. These exhaust ports 15 are coupled to a suction device (not shown) so that the pure water, received on the liquid pan 63, is forcibly exhausted together with surrounding gas through the exhaust ports 15.

The gas ejector 16 includes a plurality of gas intake elements 17 which have a plurality of gas intake openings 17a that are open toward a rotational direction of the substrate holder 1, a plurality of through-holes 18 formed in the cylindrical skirt 13, and a plurality of gas discharge elements 19 which have a plurality of gas discharge openings 19a located outside the cylindrical skirt 13. The gas intake elements 17 are coupled to the gas discharge elements 19 through the through-holes 18, respectively. More specifically, each gas intake opening 17a communicates with each gas discharge opening 19a through the corresponding through-hole 18.

Figure 2:
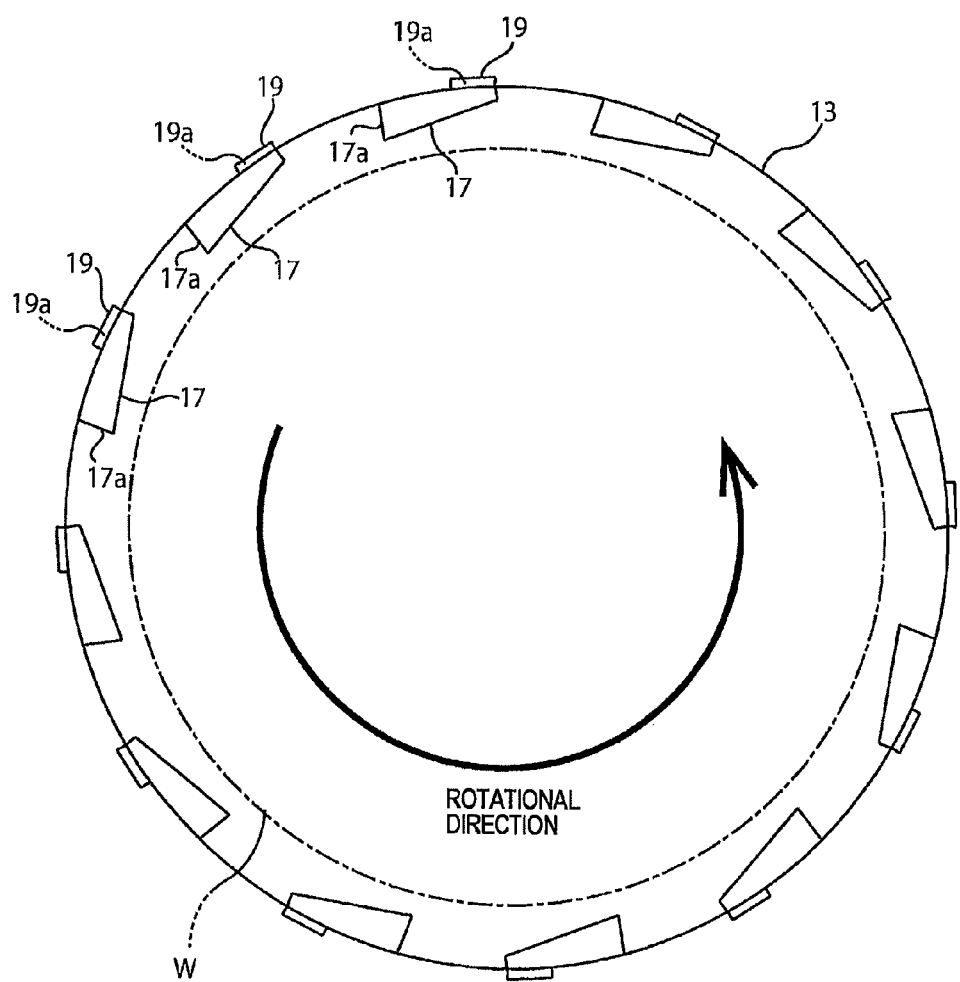
FIG. 2 is a plan view of a gas ejector provided in the substrate cleaning and drying apparatus shown in FIG. 1.

FIG. 2 is a plan view of the gas ejector 16 of the substrate cleaning and drying apparatus shown in FIG. 1. The gas intake elements 17 are secured to an inner circumferential surface of the cylindrical skirt 13, and are arranged at equal intervals along a circumferential direction of the cylindrical skirt 13. The gas discharge elements 19 are secured to an outer circumferential surface of the cylindrical skirt 13, and are arranged at equal intervals along the circumferential direction of the cylindrical skirt 13. Each of the gas intake elements 17 has a hermetically enclosed structure except for the gas intake opening 17a and the through-hole 18. Each of the gas discharge element 19 has a hermetically enclosed structure except for the gas discharge opening 19a and the through-hole 18. As shown in FIG. 2, the gas intake openings 17a and the gas discharge openings 19a are arranged along an entire circumference of the substrate W, as viewed from an axial direction of the substrate W. The gas intake openings 17a and the gas discharge openings 19a are arranged at equal intervals along the circumferential direction of the substrate W.

When the cylindrical skirt 13 is rotated together with the substrate holder 1, the air, which is present inside the cylindrical skirt 13, is taken in through the gas intake openings 17a. The air flows through the gas intake elements 17, the through-holes 18, and the gas discharge elements 19 in this order, and is discharged downwardly from the gas discharge openings 19a located outside the cylindrical skirt 13. As a result, uniform downward flow of the air is formed around the cylindrical skirt 13. This downward flow of the air produces negative pressure in a space located below the substrate W.

The gas ejector 16 is disposed below the substrate W held by the substrate holder 1. More specifically, the gas ejector 16 is located below the substrate holder 1. When the gas ejector 16 produces the uniform negative pressure in an annular space below the substrate W, the uniform downward flow is induced around the entire circumference of the substrate W held by the substrate holder 1. Hereinafter, the gas ejector 16 will be explained.

Figure 3A:
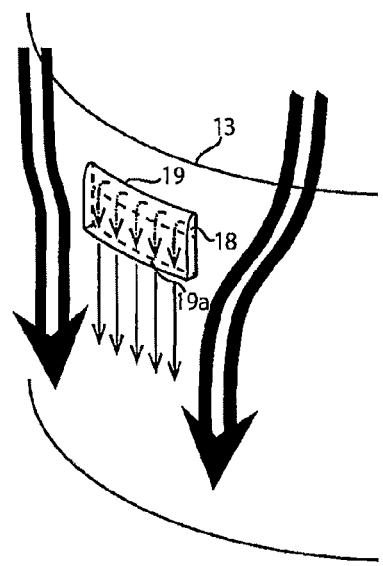
FIG. 3A, FIG. 3B, and FIG. 3C are drawings each illustrating a manner in which downward flow is induced around a substrate by the gas ejector.
Figure 3B:
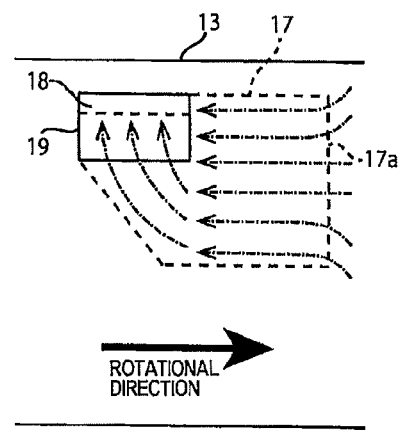
Figure 3C:
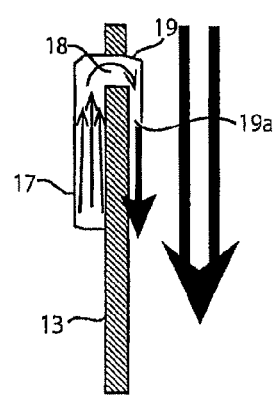

FIG. 3A through FIG. 3C are drawings explaining a manner in which the downward flow is induced around the substrate W by the gas ejector 16. More specifically, FIG. 3A shows a schematic perspective view of the gas ejector 16 on the cylindrical skirt 13 as viewed from the outside of the gas ejector 16, FIG. 3B shows a schematic side view of the gas ejector 16 on the cylindrical skirt 13 as viewed from the outside of the gas ejector 16, and FIG. 3C shows a schematic cross-sectional view of the gas ejector 16 on the cylindrical skirt 13. In FIGS. 3A through 3C, only one gas intake element 17 and only one gas discharge element 19 are shown in order to simplify the explanation.

When the cylindrical skirt 13 is rotated together with the substrate holder 1 by the motor 2, the air flows through the gas intake opening 17a into the gas intake element 17 as shown in FIG. 3B. The air in the gas intake element 17 is collected toward the slit-like through-hole 18 to thereby increase its flow velocity, and flows through the through-hole 18 into the gas discharge element 19 (see FIG. 3C). As shown in FIG. 3A, the air flowing into the gas discharge element 19 is discharged downwardly through the gas discharge opening 19a that is provided at the lower portion of the gas discharge element 19. In this manner, the gas ejector 16 forms the downward flow at the outside of the cylindrical skirt 13 by taking in the air that is present inside the cylindrical skirt 13 and discharging the air at the outside of the cylindrical skirt 13.

An opening area of the gas discharge opening 19a is sufficiently smaller than an opening area of the gas intake opening 17a. Therefore, the downward flow is discharged from the gas discharge opening 19a with an increased velocity. This downward flow, which is formed below the substrate W, produces the negative pressure around the gas discharge element 19 according to the Venturi effect. A downward flow of the air is induced around the substrate W and the substrate holder 1 as a result of this negative pressure (see double arrows in FIG. 3A and FIG. 3B). Since the gas discharge elements 19 are arranged at equal intervals along the circumferential direction of the substrate W and the cylindrical skirt 13, the negative pressure is evenly formed around the entire circumference of the substrate holder 1. Therefore, the uniform downward flow is induced around the substrate W.

The velocity or a flow rate of the downward flow formed between the peripheral portion of the substrate W and the cylindrical cup 3 depends on a flow velocity or a flow rate of the air discharged from the gas discharge elements 19. Therefore, a ratio of the opening area of the gas discharge opening 19a to the opening area of the gas intake opening 17a is appropriately determined in consideration of a required flow velocity or flow rate of the downward flow and a rotational speed of the substrate holder 1.

Figure 4:
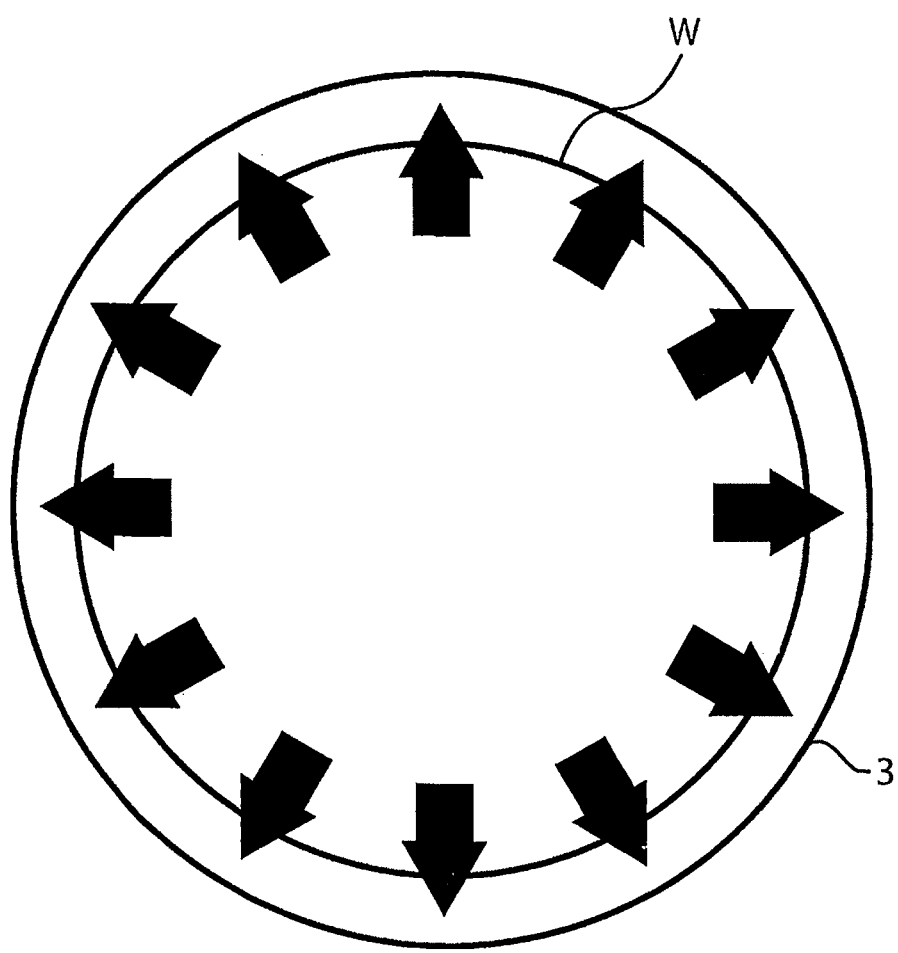
FIG. 4 is a schematic view showing a state in which an exhaust environment becomes uniform.

In this manner, the gas ejector 16 induces the downward flow in a gap between the peripheral portion of the substrate W and the cylindrical cup 3 around the substrate W in its entirety. Therefore, an exhaust environment around the substrate can be uniform. The downward flow can prevent water-marks and a back contamination that could be caused by mist and droplets of the pure water attached again to the surface of the substrate W. Furthermore, since the exhaust environment around the substrate can be uniform, the peripheral portion of the substrate can be uniformly dried. FIG. 4 shows a schematic view illustrating the uniform exhaust environment around the substrate.

Figure 5A:
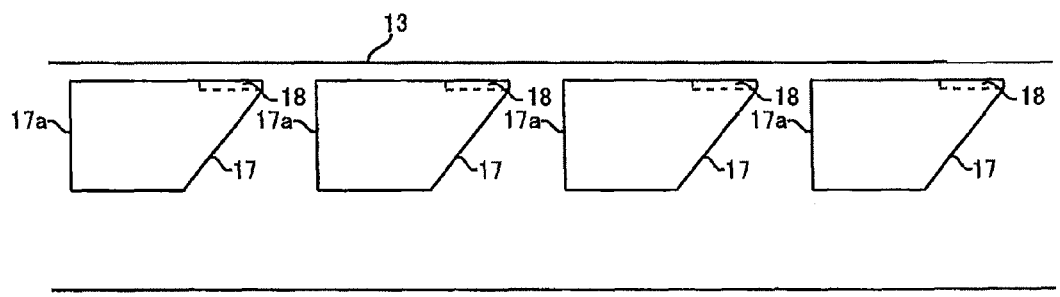
FIG. 5A and FIG. 5B are development views each showing a part of gas intake elements mounted to a cylindrical skirt as viewed from a lateral direction.
Figure 5B:
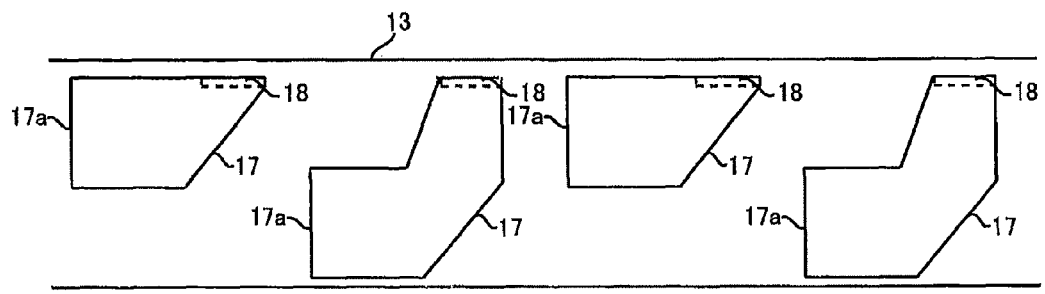

Next, a modification of the first embodiment will be explained with reference to FIG. 5A and FIG. 5B. FIG. 5A and FIG. 5B are development views each showing a part of gas intake elements 17 mounted to the cylindrical skirt 13 as viewed from a lateral direction. More specifically, FIG. 5A shows the above-described gas intake elements 17 shown in FIG. 3B, and FIG. 5B shows a modified example of the gas intake elements 17.

All the gas intake openings 17a of the gas intake elements 17 shown in FIG. 5A are located at the same height. With this arrangement, an upstream-side gas intake element 17 may disturb an air flow at a gas intake opening 17a of a downstream-side gas intake element 17, thus making it difficult for the downstream-side gas intake element 17 to take in the air. Thus, in the modified example shown in FIG. 5B, the gas intake openings 17a are staggered with respect to the vertical direction such that the heights of the gas intake openings 17a of the adjacent gas intake elements 17 are different from each other. Such arrangement enables each gas intake element 17 to take in the air easily from its gas intake opening 17a.

Figure 6A:
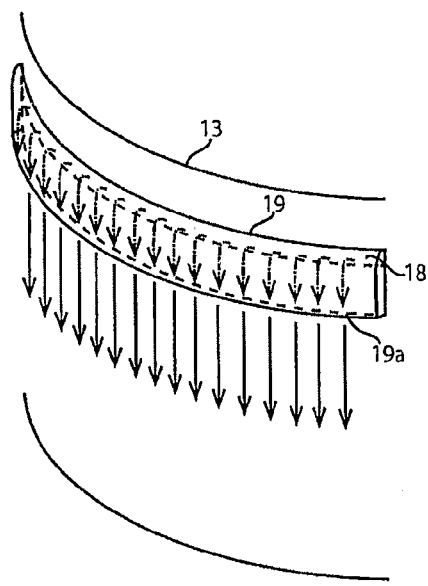
FIG. 6A, FIG. 6B, and FIG. 6C are drawings each illustrating a manner in which downward flow is induced around a substrate holder by a modified example of the gas ejector.
Figure 6B:
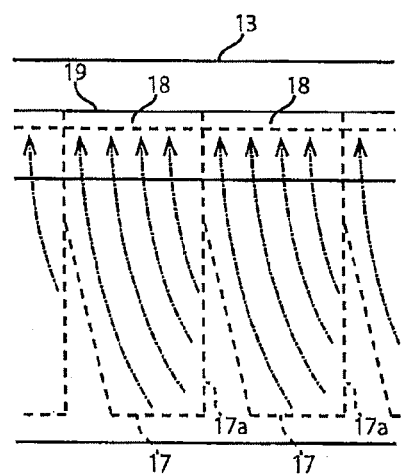
Figure 6C:
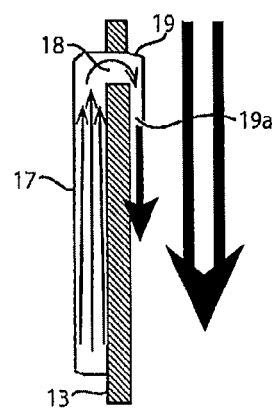
Figure 7:
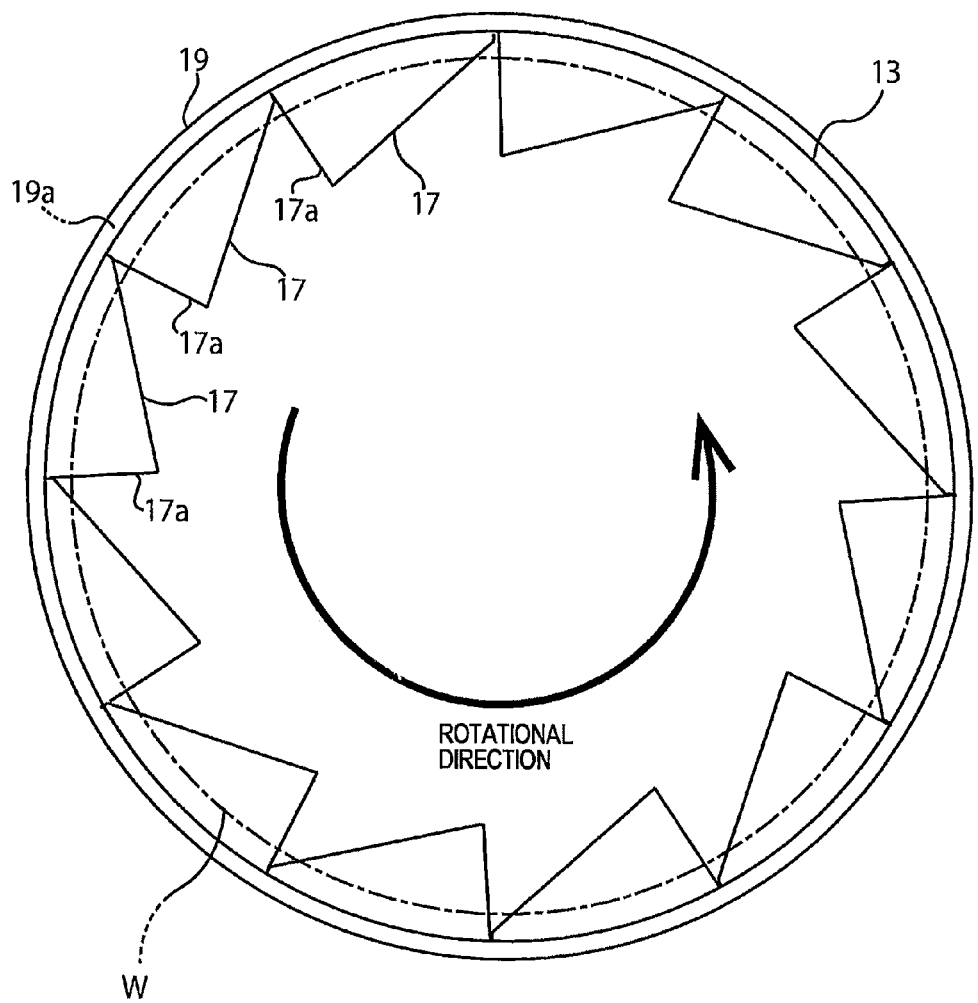
FIG. 7 is a plan view of the gas ejector shown in FIGS. 6A through 6C.

Another modified example of the first embodiment will be explained with reference to FIG. 6A through FIG. 6C and FIG. 7. FIGS. 6A through 6C are drawings for explaining a manner in which the downward flow is induced around the substrate W by modified example of the gas ejector 16. More specifically, FIG. 6A shows a schematic perspective view of the gas ejector 16 on the cylindrical skirt 13 as viewed from the outside of the gas ejector 16, FIG. 6B shows a schematic side view of the gas ejector 16 on the cylindrical skirt 13 as viewed from the outside of the gas ejector 16, and FIG. 6C shows a schematic cross-sectional view of the gas ejector 16 on the cylindrical skirt 13. FIG. 7 shows a plan view of the gas ejector 16 shown in FIGS. 6A through 6C.

In this modified example, a single common annular gas discharge element 19 is provided for the plurality of gas intake elements 17. As shown in FIG. 6B, the adjacent gas intake elements 17 are connected to each other. The multiple gas intake elements 17 are disposed on the inner circumferential surface of the cylindrical skirt 13 along the circumferential direction of the cylindrical skirt 13, and the annular gas discharge element 19 is disposed on the outer circumferential surface of the cylindrical skirt 13. This arrangement can make the exhaust environment more uniform around the substrate W held by the substrate holder 1.

Figure 8:
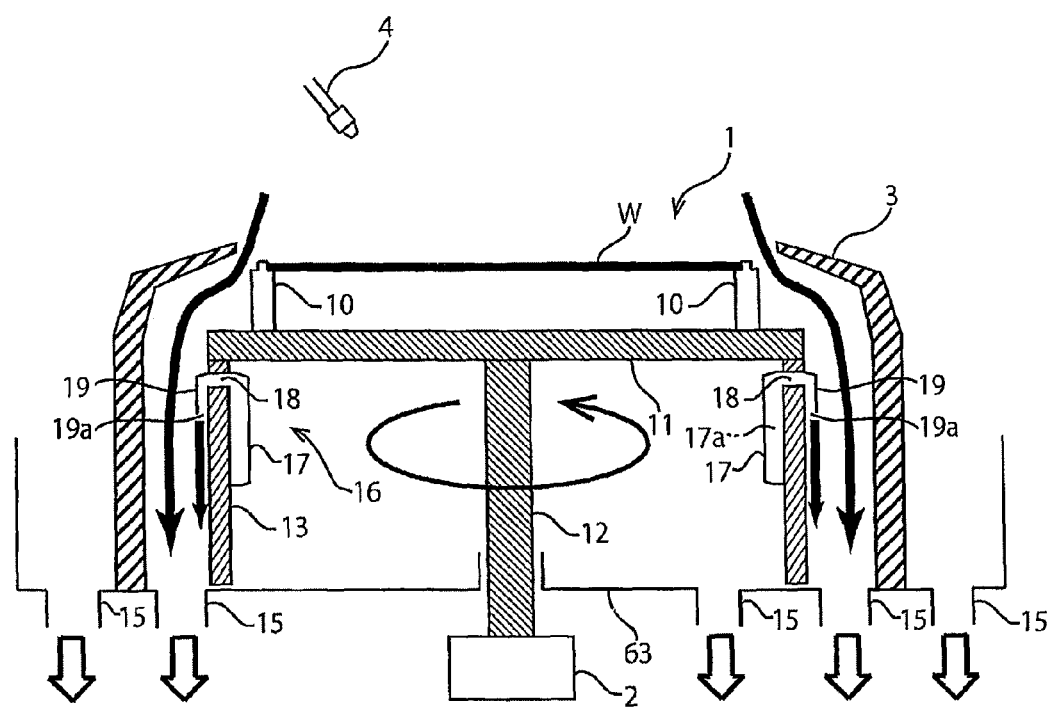
FIG. 8 is a schematic cross-sectional view showing the substrate cleaning and drying apparatus according to a modified example of the first embodiment.

Still another modified example of the first embodiment will be explained with reference to FIG. 8. FIG. 8 is a schematic cross-sectional view showing the substrate cleaning and drying apparatus according to the still another modified example of the first embodiment. As shown in FIG. 8, in this modified example, the cylindrical skirt 13 extends downwardly such that a lower end of the cylindrical skirt 13 is located close to an upper surface of the liquid pan 63. The exhaust ports 15, which are located between the cylindrical skirt 13 and the cylindrical cup 3, are formed in the liquid pan 63 so as to discharge the gas from a space between the cylindrical skirt 13 and the cylindrical cup 3. Such construction can prevent the downward flow, induced by the operation of the gas ejector 16, from forming turbulence below the substrate stage 11. As a result, the exhaust environment can be more uniform around the substrate W held by the substrate holder 1.

When the substrate W is cleaned, the substrate W is rotated by the motor 2 at a relatively low speed (for example, about 300 to 600 $min^{-1}$). In this state, the pure water as the cleaning liquid is supplied from the cleaning liquid supply nozzle 4 onto the center of the surface of the substrate W. The pure water supplied onto the substrate W spreads over the entire surface of the substrate W by a centrifugal force, so that the substrate W in its entirety is covered with the pure water. The pure water, spun off from the rotating substrate W, is caught by the cylindrical cup 3, flows downwardly on the inner circumferential surface of the cylindrical cup 3, and flows into the exhaust ports 15.

When the substrate W is dried, the substrate W is rotated at a relatively high speed (for example, about 1000 to 2000 $min^{-1}$), so that the substrate W is dried by expelling the remaining pure water from the surface of the substrate W. Both during the cleaning process and the drying process, the gas ejector 16 can form the uniform downward flow around the substrate in its entirety, thereby preventing the mist and the droplets of the pure water from being attached again to the surface of the substrate W. Moreover, the peripheral portion of the substrate W in its entirety can be dried uniformly.

Figure 9:
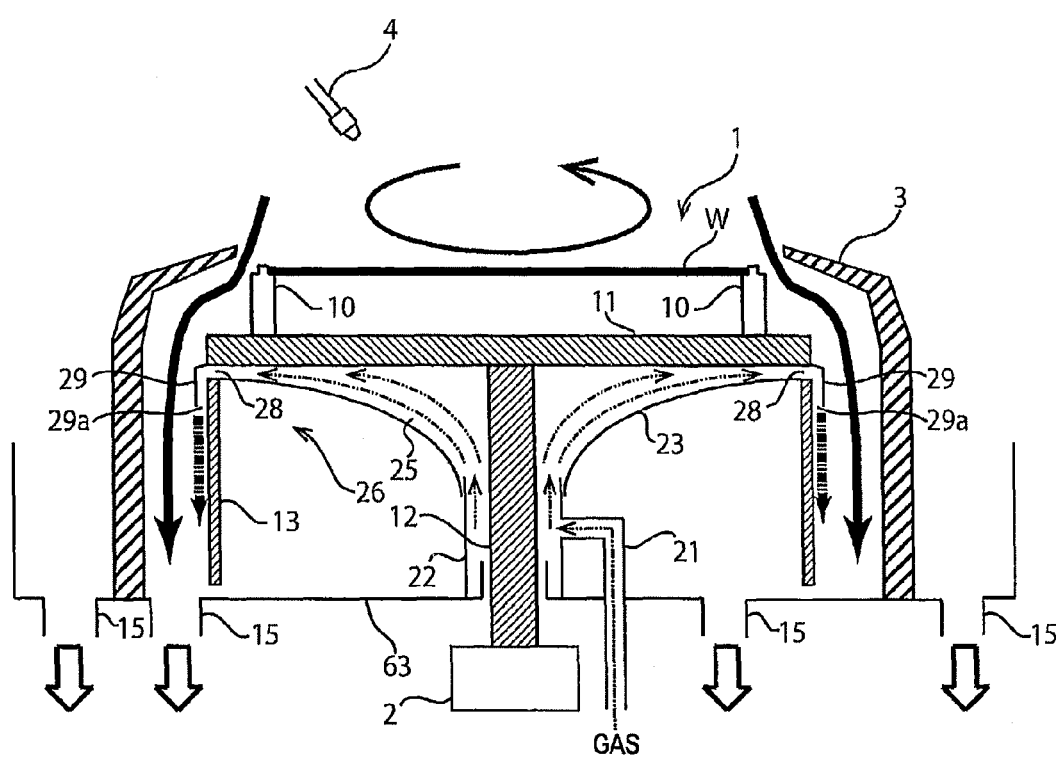
FIG. 9 is a schematic cross-sectional view showing the substrate cleaning and drying apparatus according to a second embodiment.

Next, the substrate cleaning and drying apparatus according to a second embodiment will be explained with reference to FIG. 9. FIG. 9 is a schematic cross-sectional view showing the substrate cleaning and drying apparatus according to the second embodiment. Structures and operations of this embodiment, which will not be explained below particularly, are identical to those of the first embodiment. Therefore, repetitive explanations will be omitted.

In the second embodiment shown in FIG. 9, a gas ejector 26 is provided on the cylindrical skirt 13 extending downwardly from the peripheral edge of the substrate stage 11. This gas ejector 26 includes a plurality of through-holes 28 formed in the cylindrical skirt 13, a vertical pipe 22 in a cylindrical shape disposed around the support shaft 12, a gas supply pipe 21 which supplies the gas (i.e., the working gas), such as nitrogen gas or dry air, into the vertical pipe 22, a guide pipe 23 which is loosely coupled to an upper end of the vertical pipe 22 and communicates with the through-holes 28, and a plurality of gas discharge elements 29 having a plurality of gas discharge openings 29a for discharging downwardly the gas, which has passed through the through-holes 28, at the outside of the cylindrical skirt 13. The guide pipe 23 is coupled to the gas discharge elements 29 through the through-holes 28.

The guide pipe 23 is a tapered pipe whose upper open end has a diameter larger than a diameter of its lower open end. The upper open end of the guide pipe 23 is located immediately below the substrate stage 11, and is connected to the cylindrical skirt 13 at a position lower than the through-holes 28. The lower open end of the guide pipe 23 is disposed so as to surround the upper end of the vertical pipe 22. A gas passage 25 communicating with the through-holes 28 is formed between the guide pipe 23 and a lower surface of the substrate stage 11. The vertical pipe 22 is secured to the upper surface of the liquid pan 63 and is in a static state, while the guide pipe 23 is rotated together with the substrate stage 11, the cylindrical skirt 13, and the substrate W.

The gas supply pipe 21 is coupled to a gas supply source (not shown) which supplies the gas, such as nitrogen gas or dry air. The through-holes 28 are arranged at equal intervals along the circumferential direction of the cylindrical skirt 13. The gas discharge openings 29a are arranged along the entire circumference of the substrate W when viewed from the axial direction of the substrate W. The gas discharge openings 29a are arranged at equal intervals along the circumferential direction of the substrate W. The gas discharge elements 29 are arranged at positions corresponding to the positions of the through-holes 28, as with the first embodiment shown in FIG. 2. Alternatively, an annular gas discharge element 29 having a single annular gas discharge opening 29a may be provided around the entire circumference of the cylindrical skirt 13, as with the example shown in FIG. 7.

In this gas ejector 26, the gas (for example, nitrogen gas or dry air) is introduced into the vertical pipe 22 through the gas supply pipe 21, flows into the guide pipe 23, and is guided to the through-holes 28 by the guide pipe 23. Then, the gas is discharged downwardly from the gas discharge openings 29a of the gas discharge elements 29 to form uniform downward flow of the gas around the cylindrical skirt 13. In this manner, a gas delivery conduit that delivers the gas, supplied from the gas supply source, to the gas discharge openings 29a is constituted by the gas supply pipe 21, the vertical pipe 22, the guide pipe 23, the through-holes 28, and the gas discharge elements 29.

The negative pressure is produced around the gas discharge elements 29 by the downward flow discharged from the gas discharge openings 29a. The action of this negative pressure induces the uniform downward flow around the entire circumference of the substrate W held by the substrate holder 1. According to the present embodiment, the desired downward flow around the substrate W can be generated by simply adjusting the flow rate of the gas (for example, nitrogen gas or dry air), regardless of the rotational speed of the substrate holder 1.

The flow velocity or the flow rate of the downward flow formed between the peripheral portion of the substrate W and the cylindrical cup 3 depends on the flow velocity or the flow rate of the gas discharged from the gas discharge openings 29a. Therefore, in order to increase the flow velocity of the gas discharged from the gas discharge openings 29a, the guide pipe 23 is preferably constructed such that a height of the gas passage 25 between the guide pipe 23 and the substrate stage 11 is gradually narrowed as the gas moves toward the through-holes 28.

Figure 10:
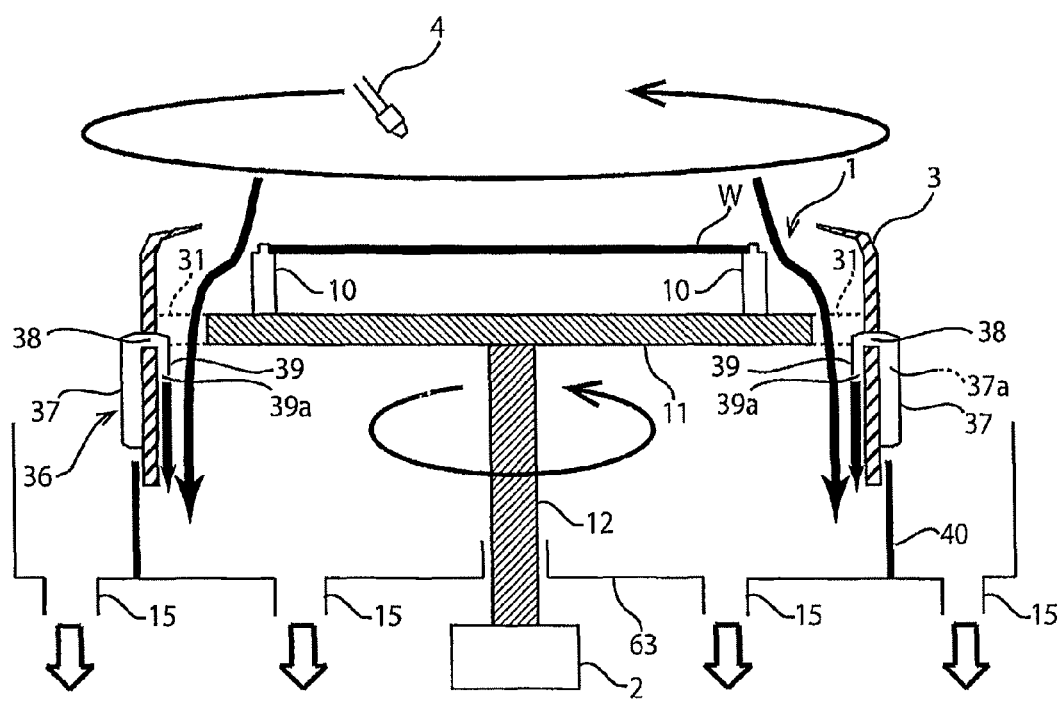
FIG. 10 is a schematic cross-sectional view showing the substrate cleaning and drying apparatus according to a third embodiment.

Next, the substrate cleaning and drying apparatus according to a third embodiment will be explained with reference to FIG. 10. FIG. 10 is a schematic cross-sectional view showing the substrate cleaning and drying apparatus according to the third embodiment. Structures and operations of the present embodiment, which will not be explained below particularly, are identical to those of the first embodiment. Therefore, repetitive explanations will be omitted.

In the third embodiment shown in FIG. 10, the cylindrical cup 3 is separated from the liquid pan 63, and is coupled to the substrate holder 1 through coupling members 31. Thus, the cylindrical cup 3 is rotated in synchronization with the substrate holder 1. In FIG. 10, the coupling members 31 are depicted by dotted line. A gas ejector 36 is provided on this cylindrical cup 3. The gas ejector 36 has substantially the same structures and functions as those of the gas ejector 16, except for a location thereof.

The gas ejector 36 includes a plurality of gas intake elements 37 having a plurality of gas intake opening 37a that are open toward the rotational direction of the substrate holder 1, a plurality of through-holes 38 formed in the cylindrical cup 3, a plurality of gas discharge elements 39 having a plurality of gas discharge openings 39a located inside the cylindrical cup 3. The gas intake elements 37 are coupled to the gas discharge elements 39 through the through-holes 38, respectively. More specifically, each gas intake opening 37a communicates with each gas discharge opening 39a through the corresponding through-hole 38.

The gas intake elements 37 are secured to the outer circumferential surface of the cylindrical cup 3, and are arranged at equal intervals along the circumferential direction of the cylindrical cup 3. The gas discharge elements 39 are secured to the inner circumferential surface of the cylindrical cup 3, and are arranged at equal intervals along the circumferential direction of the cylindrical cup 3. Each of the gas intake elements 37 has a hermetically enclosed structure except for the gas intake opening 37a and the through-hole 38. Each of the gas discharge element 39 has a hermetically enclosed structure except for the gas discharge opening 39a and the through-hole 38. The gas intake openings 37a and the gas discharge openings 39a are arranged along the entire circumference of the substrate W when viewed from the axial direction of the substrate W. The gas intake openings 37a and the gas discharge openings 39a are arranged at equal intervals along the circumferential direction of the substrate W.

When the cylindrical cup 3 is rotated together with the substrate holder 1, the air, which is present outside the cylindrical cup 3, is taken in through the gas intake openings 37a. The air flows through the gas intake elements 37, the through-holes 38, and the gas discharge elements 39 in this order, and is discharged downwardly from the gas discharge openings 39a located inside the cylindrical cup 3. As a result, uniform downward flow of the air is formed inside the cylindrical cup 3. This downward flow of the air produces negative pressure in a space located below the substrate W.

An outer shielding cover 40 having a cylindrical shape is provided outside the lower portion of the cylindrical cup 3. This outer shielding cover 40 is secured to the upper surface of the liquid pan 63. A very small gap is formed between the lower portion of the cylindrical cup 3 and an upper portion of the outer shielding cover 40. This outer shielding cover 40 prevents the downward flow generated by the gas ejector 36 from escaping to the outside of the cylindrical cup 3.

When the cylindrical cup 3 is rotated together with the substrate holder 1 by the motor 2, the air flows through the gas intake opening 37a into the gas intake element 37. The air in the gas intake element 37 is collected toward the slit-like through-hole 38 to thereby increase its flow velocity, and flows through the through-hole 38 into the gas discharge element 39. The air flowing into the gas discharge element 39 is discharged downwardly through the gas discharge opening 39a that is provided at the lower portion of the gas discharge element 39. In this manner, the gas ejector 36 forms the uniform downward flow at the inside of the cylindrical cup 3 by taking in the air that is present outside the cylindrical cup 3 and discharging the air at the inside of the cylindrical cup 3.

The downward flow that has been discharged from the gas discharge openings 39a produces the negative pressure around the gas discharge elements 39 according to the Venturi effect. The action of the negative pressure induces downward flow of the air around the substrate W and the substrate holder 1. Since the gas discharge elements 39 are arranged at equal intervals along the circumferential direction of the substrate W and the cylindrical cup 3, the negative pressure is uniformly formed around the entire circumference of the substrate holder 1. Therefore, the uniform downward flow is induced around the substrate W.

The flow velocity or the flow rate of the downward flow formed between the peripheral portion of the substrate W and the cylindrical cup 3 depends on the flow velocity or the flow rate of the air discharged from the gas discharge elements 39. Therefore, a ratio of an opening area of the gas discharge opening 39a to an opening area of the gas intake opening 37a is appropriately determined in consideration of a required flow velocity or flow rate of the downward flow and the rotational speed of the substrate holder 1.

Figure 11:
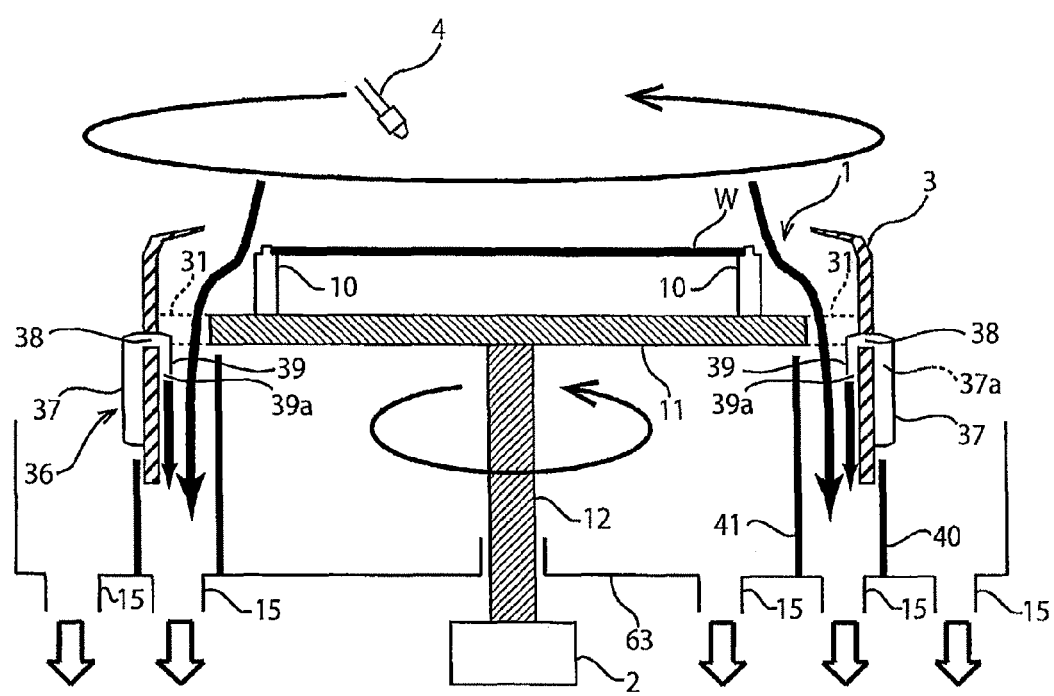
FIG. 11 is a schematic cross-sectional view showing the substrate cleaning and drying apparatus according to a modified example of the third embodiment.

The same modifications as those of the gas ejector 16 can be applied to the gas ejector 36. More specifically, in the third embodiment, as shown in FIG. 11, an inside shielding cover 41, having a cylindrical shape and extending from the liquid pan 63 to a position close to the peripheral edge of the substrate stage 11, may be provided inside the cylindrical cup 3, and the exhaust ports 15 may be disposed between the outer shielding cover 40 and the inside shielding cover 41. Such construction can prevent the downward flow, induced by the gas ejector 36, from forming turbulence below the substrate stage 11. As a result, the exhaust environment can be more uniform around the substrate W held by the substrate holder 1.

Furthermore, although not shown in drawings, the outer shielding cover 40 may be omitted, and the lower end of the cylindrical cup 3 may extend close to the upper surface of the liquid pan 63. Furthermore, like the example shown in FIG. 5B, the gas intake openings 37a may be staggered with respect to the vertical direction such that the heights of the gas intake openings 37a of the adjacent gas intake elements 37 are different from each other. Furthermore, like the example shown in FIGS. 6A and 6B, a single common annular gas discharge element 39 may be provided for the plurality of gas intake elements 37.

Figure 12:
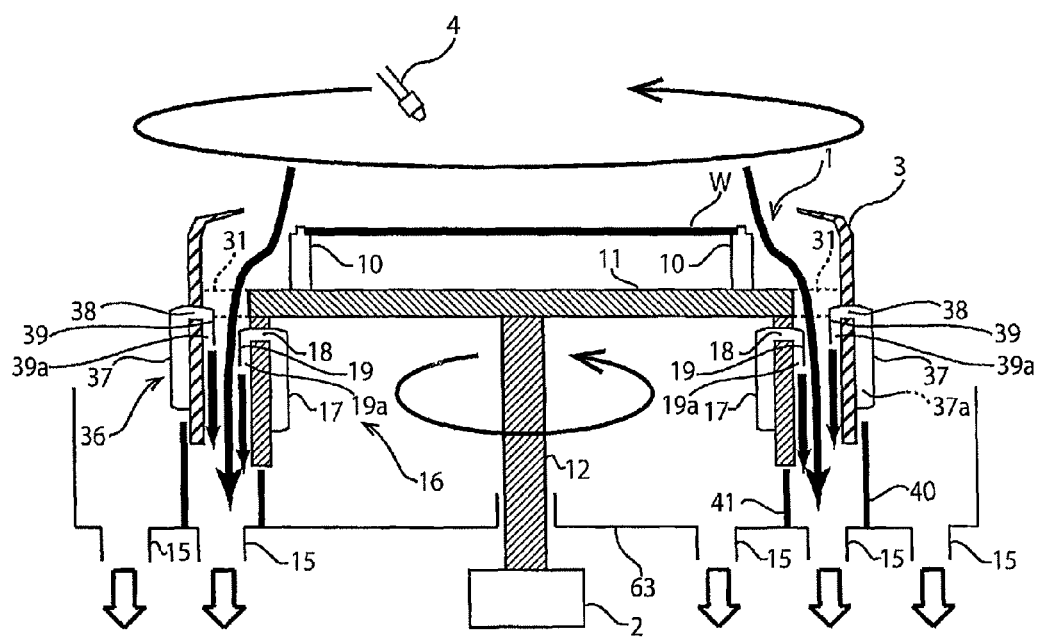
FIG. 12 is a schematic cross-sectional view showing the substrate cleaning and drying apparatus according to a fourth embodiment.

Next, a fourth embodiment will be explained with reference to FIG. 12. FIG. 12 is a schematic cross-sectional view showing the substrate cleaning and drying apparatus according to the fourth embodiment. As shown in FIG. 12, the fourth embodiment is an embodiment in which the gas ejector 16 and the gas ejector 36 are combined. More specifically, the cylindrical skirt 13 extends downwardly from the peripheral edge of the substrate stage 11, and the cylindrical cup 3 is coupled to the substrate holder 1 through the coupling members 31, so that the cylindrical cup 3 is rotated in synchronization with the substrate holder 1. The above-described gas ejector 16 is provided on the cylindrical skirt 13, and the above-described gas ejector 36 is provided on the cylindrical cup 3.

With this construction, both the gas ejector 16 and the gas ejector 36 induce the downward flow of the air around the substrate W held by the substrate holder 1. Since the negative pressure is produced by both the gas ejector 16 and the gas ejector 36, the sufficient downward flow can be induced, even if the negative pressure is inadequate in either the gas ejector 16 or the gas ejector 36 due to lack of the rotational speed of the substrate holder 1.

Figure 13:
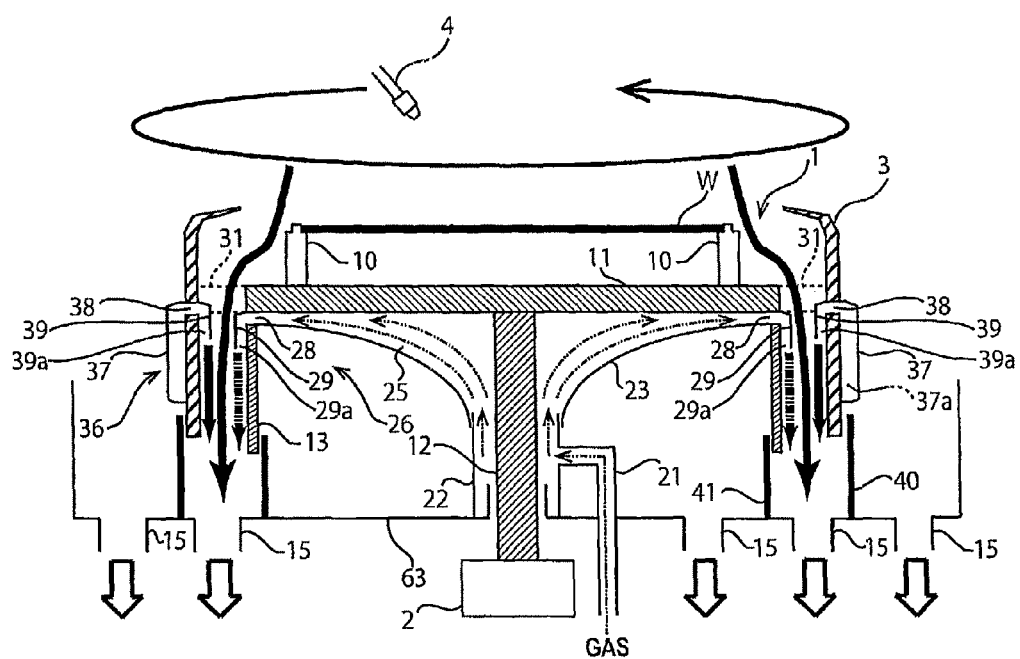
FIG. 13 is a schematic cross-sectional view showing the substrate cleaning and drying apparatus according to a fifth embodiment.

Next, a fifth embodiment will be explained with reference to FIG. 13. FIG. 13 is a schematic cross-sectional view showing the substrate cleaning and drying apparatus according to the fifth embodiment. As shown in FIG. 13, the fifth embodiment is an embodiment in which the gas ejector 26 and the gas ejector 36 are combined. More specifically, the cylindrical skirt 13 extends downwardly from the peripheral edge of the substrate stage 11, and the cylindrical cup 3 is coupled to the substrate holder 1 through the coupling members 31, so that the cylindrical cup 3 is rotated in synchronization with the substrate holder 1. The above-described gas ejector 26 is provided on the cylindrical skirt 13, and the above-described gas ejector 36 is provided on the cylindrical cup 3.

With this construction, both the gas ejector 26 and the gas ejector 36 induce the downward flow of the air around the substrate holder 1. Since the negative pressure is produced by both the gas ejector 26 and the gas ejector 36, the sufficient downward flow can be induced, even if the negative pressure is inadequate in either the gas ejector 26 or the gas ejector 36. Furthermore, since the gas ejector 26 can easily adjust the negative pressure by regulating the flow rate of the gas (for example, nitrogen gas or dry air) flowing into the gas ejector 26, a fine adjustment of the negative pressure can be performed.

Figure 14:
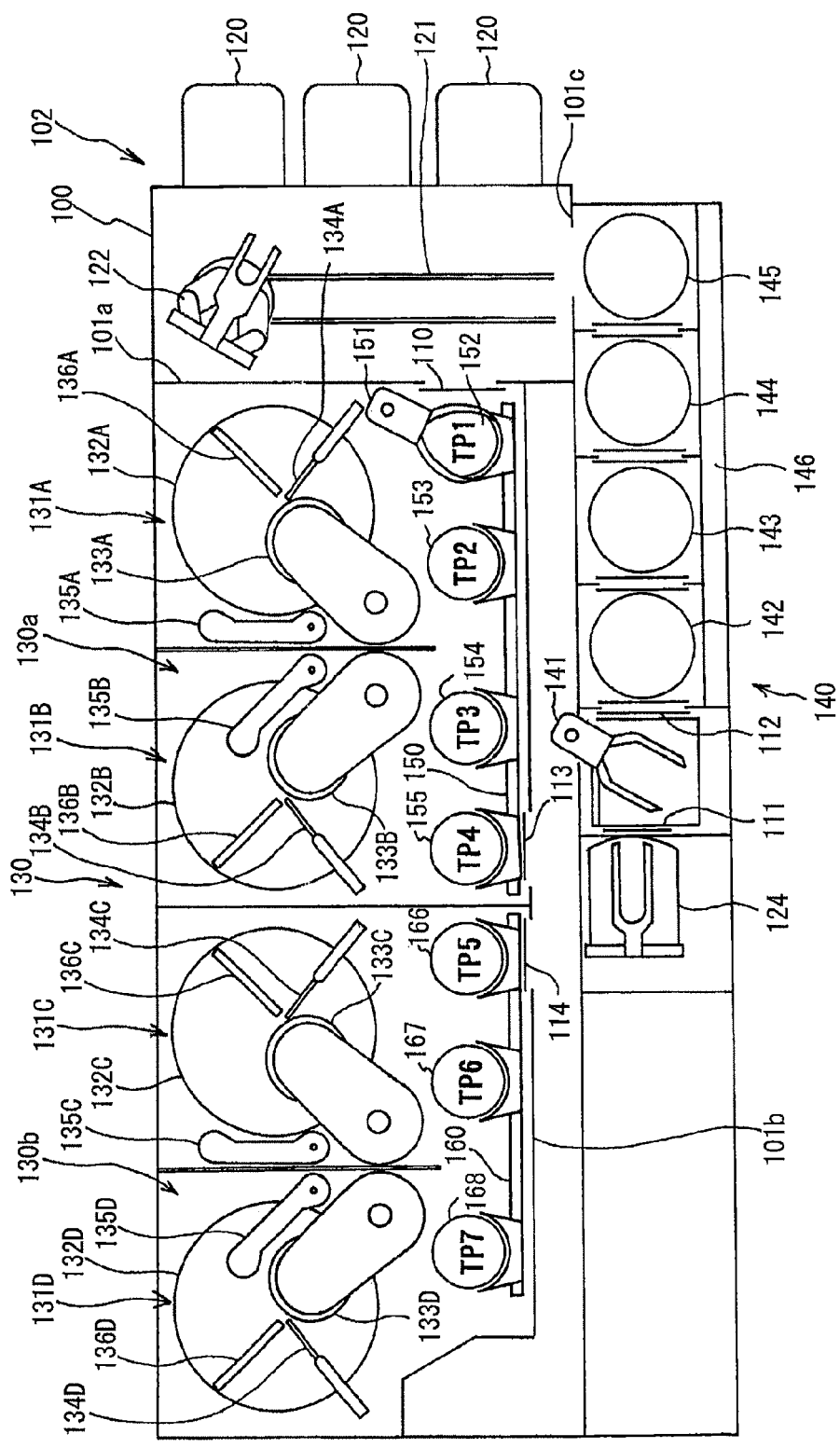
FIG. 14 is a plan view showing an arrangement of a polishing apparatus which includes the substrate cleaning and drying apparatus according to any one of the first embodiment through the fifth embodiment.
Figure 15:
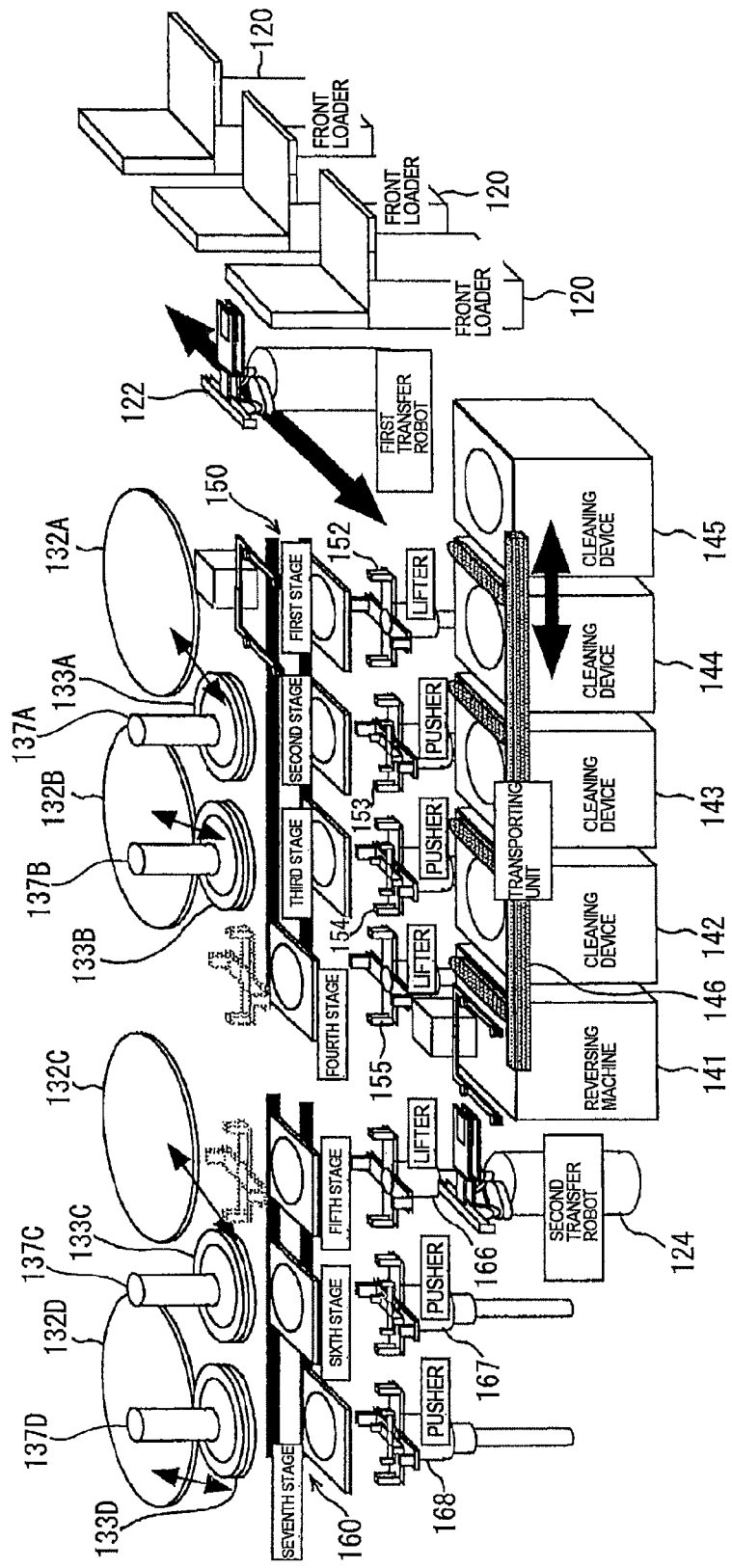
FIG. 15 is a perspective view showing an outline of the polishing apparatus shown in FIG. 14.
Figure 16:
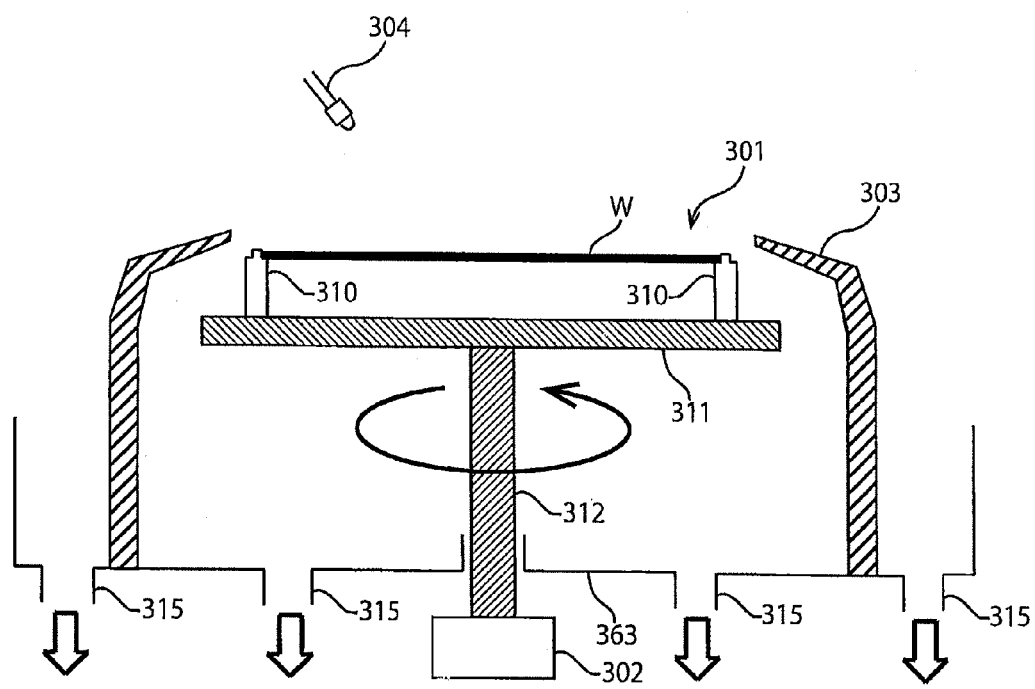
FIG. 16 is a schematic cross-sectional view showing an example of a substrate cleaning and drying apparatus.
Figure 17:
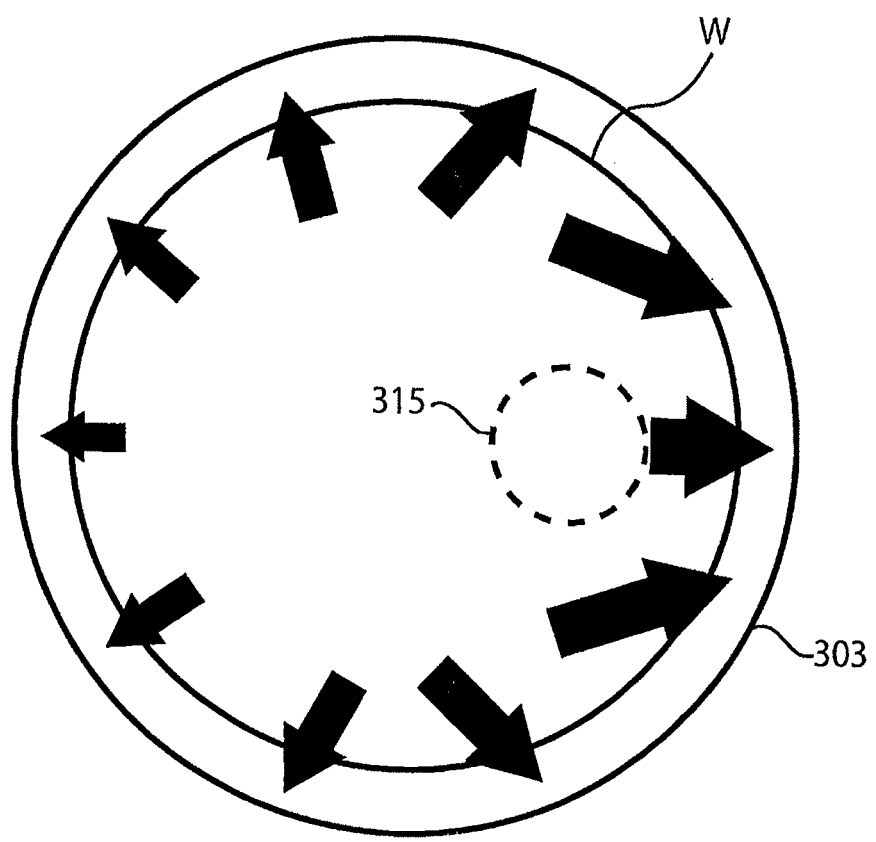
FIG. 17 is a schematic view illustrating exhaust flow inside of a cylindrical cup in a substrate cleaning and drying apparatus, flow velocity being indicated by size of arrow.
Figure 18:
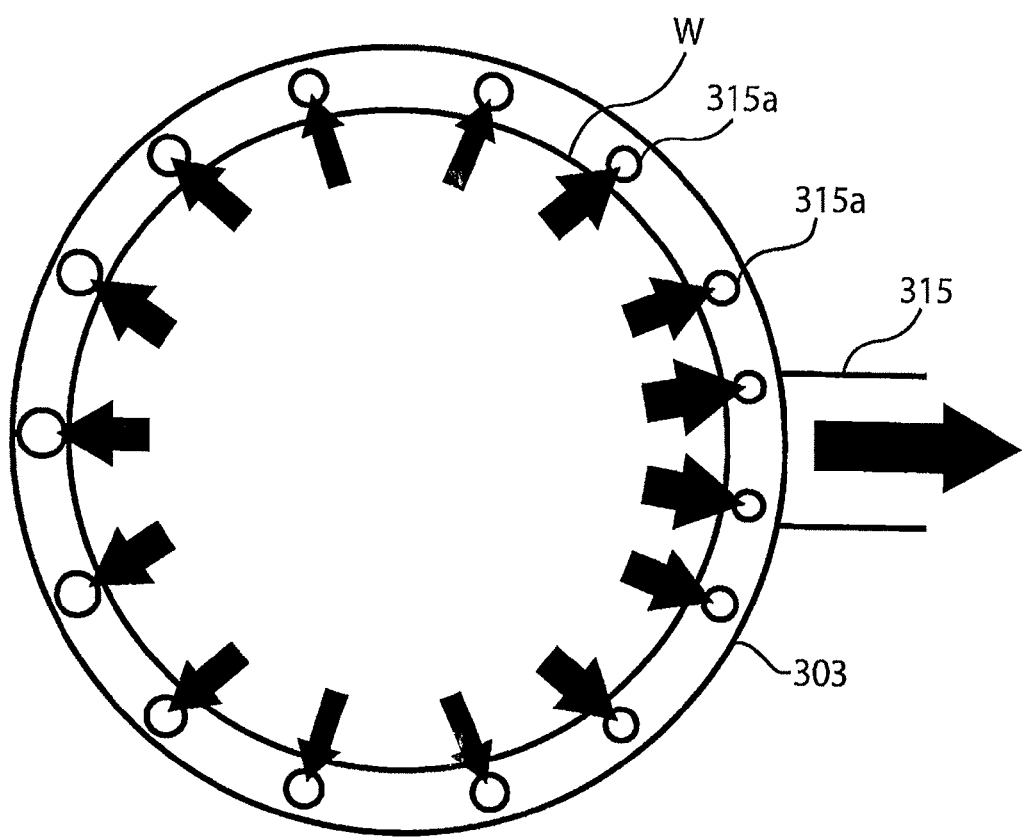
FIG. 18 is a schematic view showing the exhaust flow inside the cylindrical cup in another substrate cleaning and drying apparatus, flow velocity being indicated by size of arrow.

Next, an example of a polishing apparatus which includes the substrate cleaning and drying apparatus according to the above-described embodiments will be explained. FIG. 14 is a plan view showing an arrangement of the polishing apparatus which includes the substrate cleaning and drying apparatus according to any one of the first embodiment through the fifth embodiment. FIG. 15 is a perspective view showing an outline of the polishing apparatus shown in FIG. 14. As shown in FIG. 14, the polishing apparatus has a housing 100 in a substantially rectangular form. An interior space of the housing 100 is divided into a loading and unloading section 102, a polishing section 130 (130a, 130b), and a cleaning section 140 by partition walls 101a, 101b, 101c.

The loading and unloading section 102 has two or more front loaders 120 (e.g., three front loaders in FIG. 14) on which wafer cassettes, each storing a plurality of substrates therein, are placed. These front loaders 120 are arranged next to each other in a width direction of the polishing apparatus (a direction perpendicular to a longitudinal direction of the polishing apparatus). Each of the front loaders 120 can receive thereon an open cassette, a SMIF (Standard Manufacturing Interface) pod, or a FOUP (Front Opening Unified Pod). The SMIF and FOUP are a hermetically sealed container which houses a wafer cassette therein and is covered with a partition wall to provide an interior environment isolated from an external space.

A moving mechanism 121, extending along an arrangement direction of the front loaders 120, is provided in the loading and unloading section 102. A first transfer robot 122 is provided on the moving mechanism 121. This first transfer robot 122 is movable along the direction in which the front loaders 120 are arranged. The first transfer robot 122 can reach the wafer cassettes placed on the front loaders 120 by moving on the moving mechanism 121. The first transfer robot 122 has two hands (i.e., an upper hand and a lower hand) and can use the two hands in different ways, for example, by using the upper hand when returning a polished substrate to the wafer cassette and using the lower hand when transporting an unpolished substrate.

The loading and unloading section 102 is required to be a cleanest area. Therefore, pressure in the interior of the loading and unloading section 102 is kept higher at all times than pressures in the exterior space of the polishing apparatus, the polishing section 130, and the cleaning section 140. Further, a filter fan unit (not shown) having a clean air filter, such as HEPA filter, or ULPA filter, is provided above the moving mechanism 121 of the first transfer robot 122. This filter fan unit removes particles, toxic vapor, and toxic gas from air to produce clean air, and forms a downward flow of the clean air at all times.

The polishing section 130 is an area where the substrate is polished. The polishing section 130 includes a first polishing section 130a having a first polishing unit 131A and a second polishing unit 131B therein, and a second polishing section 130b having a third polishing unit 131C and a fourth polishing unit 131D therein. The first polishing unit 131A, the second polishing unit 131B, the third polishing unit 131C, and the fourth polishing unit 131D are arranged along the longitudinal direction of the polishing apparatus, as shown in FIG. 14.

The first polishing unit 131A includes a polishing table 132A holding a polishing pad thereon, a top ring 133A for holding the substrate and pressing the substrate against a polishing surface of the polishing pad on the polishing table 132A, a polishing liquid supply nozzle 134A for supplying a polishing liquid (e.g., a slurry) or a dressing liquid (e.g., pure water) onto the polishing surface of the polishing pad, a dresser 135A for dressing the polishing pad, and an atomizer 136A having nozzles for ejecting a mixture of a liquid (e.g., pure water) and a gas (e.g., nitrogen) in an atomized state to the polishing surface.

Similarly, the second polishing unit 131B includes a polishing table 132B, a top ring 133B, a polishing liquid supply nozzle 134B, a dresser 135B, and an atomizer 136B. The third polishing unit 131C includes a polishing table 132C, a top ring 133C, a polishing liquid supply nozzle 134C, a dresser 135C, and an atomizer 136C. The fourth polishing unit 131D includes a polishing table 132D, a top ring 133D, a polishing liquid supply nozzle 134D, a dresser 135D, and an atomizer 136D.

A first linear transporter 150 is provided in the first polishing section 130a. This first linear transporter 150 is configured to transport the substrate between four transferring positions located along the longitudinal direction of the polishing apparatus, i.e., a first transferring position TP1, a second transferring position TP2, a third transferring position TP3, and a fourth transferring position TP4, which are arranged in this order from the loading and unloading section. A reversing machine 151 for reversing the substrate transferred from the first transfer robot 122 is disposed above the first transferring position TP1 of the first linear transporter 150. A vertically movable lifter 152 is disposed below the first transferring position TP1. A vertically movable pusher 153 is disposed below the second transferring position TP2, a vertically movable pusher 154 is disposed below the third transferring position TP3, and a vertically movable lifter 155 is disposed below the fourth transferring position TP4.

In the second polishing section 130b, a second linear transporter 160 is provided next to the first linear transporter 150. This second linear transporter 160 is configured to transport the substrate between three transferring positions located along the longitudinal direction of the polishing apparatus, i.e., a fifth transferring position TP5, a sixth transferring position TP6, and a seventh transferring position TP7, which are arranged in this order from the loading and unloading section. A vertically movable lifter 166 is disposed below the fifth transferring position TP5 of the second linear transporter 160, a pusher 167 is disposed below the sixth transferring position TP6, and a pusher 168 is disposed below the seventh transferring position TP7.

As shown in FIG. 15, the first linear transporter 150 has four transfer stages: a first stage; a second stage; a third stage; and a fourth stage, which are linearly movable in a reciprocating manner. These stages have a two-line structure including an upper line and a lower line. Specifically, the first stage, the second stage and the third stage are disposed on the lower line, and the fourth stage is disposed on the upper line.

The lower and upper stages can freely move without interfering with each other, because they are provided at different heights. The first stage transports the substrate between the first transferring position TP1 and the second transferring position TP2, which is a substrate receiving and delivering position. The second stage transports the substrate between the second transferring position TP2 and the third transferring position TP3, which is a substrate receiving and delivering position. The third stage transports the substrate between the third transferring position TP3 and the fourth transferring position TP4. The fourth stage transports the substrate between the first transferring position TP1 and the fourth transferring position TP4.

The second linear transporter 160 has substantially the same structure as the first linear transporter 150. Specifically, the fifth stage and the sixth stage are disposed on an upper line, whereas the seventh stage is disposed on a lower line. The fifth stage transports the substrate between the fifth transferring position TP5 and the sixth transferring position TP6, which is a substrate receiving and delivering position. The sixth stage transports the substrate between the sixth transferring position TP6 and the seventh transferring position TP7, which is a substrate receiving and delivering position. The seventh stage transports the substrate between the fifth transferring position TP5 and the seventh transferring position TP7.

As can be understood from the fact that the slurry is used in polishing of the substrate, the polishing section 130 is the dirtiest area. Therefore, in order to prevent particles from spreading out of the polishing section 130, a gas is discharged from surrounding spaces of the respective polishing tables. In addition, pressure in the interior of the polishing section 130 is set to be lower than pressures in the exterior of the polishing apparatus, the cleaning section 140, and the loading and unloading section 102, whereby scattering of particles is prevented. Typically, exhaust ducts (not shown) are provided below the polishing tables, respectively, and filters (not shown) are provided above the polishing tables, so that downward flows of clean air are formed from the filters to the exhaust ducts.

The cleaning section 140 is an area where the polished substrate is cleaned. The cleaning section 140 includes a second transfer robot 124, a reversing machine 141 for reversing the substrate transferred from the second transfer robot 124, four cleaning units 142-145 each for cleaning the polished substrate, and a transport unit 146 for transporting the substrate between the reversing machine 141 and the cleaning units 142-145.

The second transfer robot 124, the reversing machine 141, and the cleaning units 142-145 are arranged in series along the longitudinal direction of the polishing apparatus. A filter fan unit (not shown), having a clean air filter, is provided above the cleaning units 142-145. This filter fan unit is configured to remove particles from air to produce a clean air, and to form downward flow of the clean air at all times. Pressure in the interior of the cleaning section 140 is kept higher at all times than pressure in the polishing section 130, so that particles in the polishing section 130 are prevented from flowing into the cleaning section 140.

The transport unit 146 has multiple arms for gripping the substrates. The substrates gripped by the multiple arms of the transport unit 146 are transported between the reversing machine 141 and the cleaning units 142-145 simultaneously in a horizontal direction. The cleaning unit 142 and the cleaning unit 143 may be a roll-type cleaning unit which rotates and presses upper and lower roll-shaped sponges, which are vertically arranged, against front and rear surfaces of the substrate to clean the front and rear surfaces of the substrate. The cleaning unit 144 may be a pencil-type cleaning unit which rotates and presses a hemispherical sponge against the substrate to clean the substrate. The cleaning unit 145 is the substrate cleaning and drying apparatus according to any one of the above-described embodiments. It is possible to additionally provide in any one of the cleaning units 142-144 a megasonic cleaning device, which cleans the substrate while applying an ultrasonic wave to a cleaning liquid, in addition to the above-described roll-type cleaning unit or pencil-type cleaning unit.

A shutter 110 is provided between the reversing machine 151 and the first transfer robot 122. When transporting the substrate, the shutter 110 is opened, so that the substrate can be delivered between the first transfer robot 122 and the reversing machine 151. Shutters 111, 112, 113, and 114 are disposed between the reversing machine 141 and the second transfer robot 124, between the reversing machine 141 and the primary cleaning unit 142, between the first polishing section 130a and the second transfer robot 124, and between the second polishing section 130b and the second transfer robot 124, respectively. For transporting the substrates, the shutters 111, 112, 113, and 114 are opened, so that the substrates can be delivered.

The polishing pad (not shown) is attached to an upper surface of the polishing table 132A. The polishing table 132A is coupled to a motor (not shown) disposed below the polishing table 132A, so that the polishing table 132A is rotatable about its own axis. As shown in FIG. 15, the top ring 133A is coupled to a motor and an elevating cylinder (not shown) via a top ring shaft 137A. Such construction allows the top ring 133A to move vertically and to rotate about the top ring shaft 137A. The substrate W is held on a lower surface of the top ring 133A by a vacuum suction or the like. An upper surface of the polishing pad constitutes a polishing surface with which the substrate W is brought into sliding contact.

The substrate W held on the lower surface of the top ring 133A is rotated by the top ring 133A, and is pressed against the polishing pad on the rotating polishing table 132A. During the contact between the substrate W and the polishing pad, the polishing liquid is supplied onto the polishing surface (upper surface) of the polishing pad from the polishing liquid supply nozzle 134A. The substrate W is thus polished in the presence of the polishing liquid between the substrate W and the polishing pad. A mechanism of providing relative movement between the substrate W and the polishing surface is constructed by the polishing table 132A and the top ring 133A. Since the second polishing unit 131B, the third polishing unit 131C, and the fourth polishing unit 131D have the same construction as the first polishing unit 131A, their explanations are omitted.

The polishing apparatus having such construction can perform series processing in which a substrate is successively polished in the four polishing units, and can also perform parallel processing in which two substrates are polished simultaneously.

Although the embodiments have been described above, it should be understood that the present invention is not limited to the above embodiments, but various changes and modifications may be made without departing from the scope of the appended claims.

What is claimed is:

1. A substrate cleaning and drying apparatus, comprising:
a substrate holder configured to hold a substrate;
a rotating device configured to rotate the substrate holder;
a cylindrical cup surrounding a peripheral portion of the substrate;
a gas ejector disposed below the substrate, the gas ejector having at least one gas discharge opening arranged along an entire circumference of the substrate and being configured to discharge a gas downwardly from the gas discharge opening to induce downward flow of air in a gap between a peripheral portion of the substrate and the cylindrical cup; and
a cylindrical skirt disposed below the substrate and configured to rotate together with the substrate holder,
wherein the gas ejector includes gas intake elements secured to an inner circumferential surface of the cylindrical skirt,
wherein the gas intake elements have gas intake openings that are open toward a rotational direction of the substrate holder, and
wherein the gas intake openings communicate with the gas discharge opening located outside the cylindrical skirt.

2. The substrate cleaning and drying apparatus according to claim 1, wherein the gas intake openings are staggered with respect to a vertical direction such that adjacent gas intake openings are located at different heights.

3. The substrate cleaning and drying apparatus according to claim 1, wherein the at least one gas discharge opening comprises gas discharge openings arranged at equal intervals along the entire circumference of the substrate.

4. The substrate cleaning and drying apparatus according to claim 1, wherein the at least one gas discharge opening comprises an annular gas discharge opening disposed along the entire circumference of the substrate.

5. A substrate cleaning and drying apparatus comprising:
a substrate holder configured to hold a substrate;
a rotating device configured to rotate the substrate holder;
a cylindrical cup surrounding a peripheral portion of the substrate; and
a gas ejector disposed below the substrate, the gas ejector having at least one gas discharge opening arranged along an entire circumference of the substrate and being configured to discharge a gas downwardly from the gas discharge opening to induce downward flow of air in a gap between a peripheral portion of the substrate and the cylindrical cup,
the cylindrical cup is coupled to the substrate holder to be able to rotate in synchronization with the substrate holder;
the gas ejector has gas intake elements secured to an outer circumferential surface of the cylindrical cup;
the gas intake elements have gas intake openings that are open toward a rotational direction of the substrate holder; and the gas intake openings communicate with the gas discharge opening located inside the cylindrical cup.

\* \* \* \* \*

UNITED STATES PATENT AND TRADEMARK OFFICE
CERTIFICATE OF CORRECTION

| | | |
|---|---|---|
| PATENT NO. | : 9,677,811 B2 | Page 1 of 1 |
| APPLICATION NO. | : 14/448574 | |
| DATED | : June 13, 2017 | |
| INVENTOR(S) | : Tomoatsu Ishibashi | |

It is certified that error appears in the above-identified patent and that said Letters Patent is hereby corrected as shown below:

In the Claims

Claim 5, Column 16, Line 59:
"cylindrical cup," should read "cylindrical cup, wherein"

Signed and Sealed this
Fifth Day of September, 2017

Joseph Matal
*Performing the Functions and Duties of the*
*Under Secretary of Commerce for Intellectual Property and*
*Director of the United States Patent and Trademark Office*